(12) United States Patent
Kang et al.

(10) Patent No.: US 7,348,632 B2
(45) Date of Patent: Mar. 25, 2008

(54) NMOS DEVICE FORMED ON SOI SUBSTRATE AND METHOD OF FABRICATING THE SAME

(75) Inventors: Jin Yeong Kang, Daejeon (KR); Seung Yun Lee, Daejeon (KR); Kyoung Ik Cho, Daejeon (KR)

(73) Assignee: Electronics and Telecommunications Research Institute, Daejeon-shi (KR)

( * ) Notice: Subject to any disclaimer, the term of this patent is extended or adjusted under 35 U.S.C. 154(b) by 256 days.

(21) Appl. No.: 11/019,179

(22) Filed: Dec. 23, 2004

(65) Prior Publication Data

US 2005/0139921 A1 Jun. 30, 2005

(30) Foreign Application Priority Data

Dec. 26, 2003 (KR) ............. 10-2003-0097051

(51) Int. Cl.
*H01L 27/01* (2006.01)
*H01L 27/12* (2006.01)
*H01L 31/0392* (2006.01)

(52) U.S. Cl. .............. 257/347; 257/368; 257/E27.112; 257/E29.117

(58) Field of Classification Search ........... 257/334, 257/347, 368, 369, 337, 338, 350, E27.06, 257/E27.062, E29.112, E29.117
See application file for complete search history.

(56) References Cited

U.S. PATENT DOCUMENTS 6,548,364 B2   4/2003   Hsu

| | | | |
|---|---|---|---|
| 6,933,620 B2 * | 8/2005 | Lunning et al. | 257/24 |
| 7,049,665 B2 * | 5/2006 | Yamamoto | 257/369 |
| 7,164,163 B2 * | 1/2007 | Chen et al. | 257/288 |
| 2005/0104134 A1 * | 5/2005 | Kato | 257/382 |

FOREIGN PATENT DOCUMENTS

JP   06-310719    11/1994
KR   2002-0031045  4/2002

OTHER PUBLICATIONS

Marco Mastrapasqua, et al.; "Minimizing Thermal Resistance and Collector-to-Substrate Capacitance in SiGe BiCMOS on SOI"; IEEE Transactions on Electron Devices, vol. 23, No. 3; pp. 145-147; Mar. 2002.

Joachin N. Burghartz, et al.; "A Low-Capacitance Bipolar/BiCMOS Isolation Technology, Part 1—Concept, Fabrication Process, and Characterization"; IEEE Transactions on Electron Devices, vol. 41, No. 8; pp. 1379-1387; Aug. 1994.

(Continued)

*Primary Examiner*—Hoai v Pham
(74) *Attorney, Agent, or Firm*—Lowe Hauptman Ham & Berner LLP

(57) ABSTRACT

Provided are an NMOS device, a PMOS device and a SiGe HBT device which are implemented on an SOI substrate and a method of fabricating the same. In manufacturing a Si-based high speed device, a SiGe HBT and a CMOS are mounted on a single SOI substrate. In particular, a source and a drain of the CMOS are formed of SiGe and metal, and thus leakage current is prevented and low power consumption is achieved. Also, heat generation in a chip is suppressed, and a wide operation range may be obtained even at a low voltage.

3 Claims, 8 Drawing Sheets

OTHER PUBLICATIONS

Hoon Choi, et al.; "SOI NMOSFET's with SiGe Elevated S/D and Ni Silicide"; Extended Abstracts of International Workshop on Junction Technology 2002; pp. 63-64; 2002 Japan Society of Applied Physics.

T. Linuma, et al.; "A Self-aligned Emitter Base NiSi Electrode Technology for Advanced High-Speed Bipolar LSIs"; pp. 92-95; IEEE Bipolar Circuits and Technology Meeting; 2002.

K.L. Pey, et al.; "Thermal Reaction of Nickel and $Si_{0.75}Ge_{0.25}$ Alloy"; J. Vac. Technol. A 20(6), Nov./Dec. 2002; pp. 1903-1910; 2002 American Vacuum Society.

T.H. Ning; "Why BiCMOS and SOI BiCMOS?"; IBM J. RES & Dev., vol. 46, No. 2/3, Mar./May 2002.

T. Jarmar, et al.; "Morphological and Phase Stability of Nickel-Germanosilicide on $Si_{1-x}Ge_x$ Under Thermal Stress"; Journal of Applied Physics, vol. 92, No. 112; pp. 7193-7199; Dec. 15, 2002.

* cited by examiner

NMOS DEVICE FORMED ON SOI SUBSTRATE AND METHOD OF FABRICATING THE SAME

CROSS-REFERENCE TO RELATED APPLICATION

This application claims priority to and the benefit of Korean Patent Application No. 2003-97051, filed on Dec. 26, 2003, the disclosure of which is incorporated herein by reference in its entirety.

BACKGROUND

1. Field of the Invention

The present invention relates to an NMOS device, a PMOS device and a SiGe HBT device and a method of fabricating the same and, more particularly, to an NMOS device, a PMOS device and a SiGe HBT device which are integrated on a silicon on insulator (SOI) and a method of fabricating the same 2. Discussion of Related Art Typically, gallium arsenide (GaAs)-based compound semiconductors have been employed in fabricating radio frequency (RF) devices for information communication, and complementary metal oxide semiconductor (CMOS) devices have been employed in fabricating analog/digital circuits. Currently, a RF/analog/digital system-on-chip (SoC) is widely being used, and a silicon germanium (SiGe) bipolar complementary metal oxide semiconductor (BiCMOS) device is known to be suitable for fabricating the RF/analog/digital SoC. The SiGe BiCMOS technology is one which integrates a SiGe hetero junction bipolar transistor (HBT) suitable for an RF/analog circuit and a CMOS device suitable for a digital circuit on a single substrate, and is widely used in fabricating an SoC of communication devices such a cellular phone.

The SiGe HBT is an improvement of a conventional bipolar transistor, and it uses as a base material a SiGe alloy that Ge of 20% is mixed with Si other than silicon (Si). The SiGe HBT has advantages of obtaining a larger current gain than the conventional bipolar transistor and of being able to perform high-speed and high frequency operation in that a base may be thinner by increasing an impurity concentration of the base by 100 times.

Meanwhile, a use of the SOI substrate in the CMOS is increasing due to low power consumption. However, as a gate length is scaled down to less than 100 nm in such structure, an abnormal leakage current is increased due to parasitic bipolar operation between a source and a drain, and a resistance of the source and drain layer and a resistance between the source and drain layer and a contact point with an external metal line are sharply increased, and thus heat in the chip is increased. This becomes an obstacle to practically using the device.

SUMMARY OF THE INVENTION

The present invention is directed to a SiGe BiCMOS device which has advantages of suppressing a drain induces barrier lowering (DIBL) leakage current, improving a drain breakdown voltage, reducing a sub-threshold leakage current, and reducing a body effect, and a method of fabricating the same.

The present invention is also directed to an NMOS device, a PMOS device and a SiGe HBT device which prevents a leakage current and improves a heat dissipation characteristic without reducing an effective operation range of a CMOS and a method of fabricating the same.

In a first aspect of the present invention, an NMOS device includes: a first insulating layer; a channel layer which is a p-type semiconductor, and in contact with a top surface of the first insulating layer; a source and a drain which are n-type semiconductors, and in contact with both sides of the channel layer respectively and a top surface of the first insulating layer; a gate insulating layer located on the channel layer; a gate located on the gate insulating layer; a source metal connecting layer which is a conductor, and in contact with the source and a top surface of the first insulating layer; a drain metal connecting layer which is a conductor, and in contact with the drain and a top surface of the first insulating layer; a source metal line which is a conductor, and in contact with the source metal connecting layer; a drain metal line which is a conductor, and in contact with the drain metal connecting layer; and a gate metal line which is a conductor, and in contact with the gate.

In a second aspect of the present invention, an NMOS device includes: a first insulating layer; a channel layer which is a p-type semiconductor, and in contact with a top surface of the first insulating layer; a source and a drain which are n-type semiconductors, and in contact with both sides of the channel layer respectively and a top surface of the first insulating layer; a gate insulating layer located on the channel layer; a gate located on the gate insulating layer; a source metal line which is a conductor, and in contact with the source and a top surface of the first insulating layer; a drain metal line which is a conductor, and in contact with the drain and a top surface of the first insulating layer; and a gate metal line which is a conductor, and in contact with the gate.

In a third aspect of the present invention, a PMOS device includes: a first insulating layer; a channel layer which is an n-type semiconductor, and in contact with a top surface of the first insulating layer; a source and a drain which are p-type semiconductors, and in contact with both sides of the channel layer respectively and a top surface of the first insulating layer; a gate insulating layer located on the channel layer; a gate located on the gate insulating layer; a source metal connecting layer which is a conductor, and in contact with the source and a top surface of the first insulating layer; a drain metal connecting layer which is a conductor, and in contact with the drain and a top surface of the first insulating layer; a source metal line which is a conductor, and in contact with the source metal connecting layer; a drain metal line which is a conductor, and in contact with the drain metal connecting layer; and a gate metal line which is a conductor, and in contact with the gate.

In a fourth aspect of the present invention, a PMOS device includes: a first insulating layer; a channel layer which is an n-type semiconductor, and in contact with a top surface of the first insulating layer; a source and a drain which are p-type semiconductors, and in contact with both sides of the channel layer respectively and a top surface of the first insulating layer; a gate insulating layer located on the channel layer; a gate located on the gate insulating layer; a source metal line which is a conductor, and in contact with the source and a top surface of the first insulating layer; a drain metal line which is a conductor, and in contact with the drain and a top surface of the first insulating layer; and a gate metal line which is a conductor, and in contact with the gate.

In a fifth aspect of the present invention, a BiCMOS device includes: a first insulating layer; a bipolar transistor including a collector which is an n- or p-type semiconductor and located on the first insulating layer, a collector plug located on the first insulating layer, in contact with the collector, having the same conductivity as the collector and doped at a higher concentration than the collector, a second insulating layer located on a portion that the collector and the collector plug are in contact with each other, a base located on the collector and having a conductivity different from that of the collector, and an emitter located on the base and having the same conductivity as the collector; an NMOS device including a first channel layer which is a p-type semiconductor and in contact with a top surface of the first insulating layer, a first source and a first drain which are n-type semiconductors and in contact with both sides of the first channel layer respectively and a top surface of the first insulating layer, a first gate insulating layer located on the first channel layer, and a first gate located on the first gate insulating layer; and a PMOS device including a second channel layer which is an n-type semiconductor and in contact with a top surface of the first insulating layer, a second source and a second drain which are a p-type semiconductor and in contact with both sides of the second channel layer respectively and a top surface of the first insulating layer, a second gate insulating layer located on the second channel layer, and a second gate located on the second gate insulating layer.

In a sixth aspect of the present invention, a method of fabricating an NMOS device includes: forming a field oxide layer on a silicon on insulator (SOI) substrate having a first insulating layer and a first semiconductor located on the first insulating layer; performing a p-type ion doping process on the first semiconductor located in an active area; forming a gate insulating layer on the first semiconductor; forming a gate on the gate insulating layer; performing a low concentration n-type ion doping process on the first semiconductor to form low concentration source and drain; forming a spacer on sidewalls of the gate; removing the rest portion of the first semiconductor except a portion of the first semiconductor located below the gate oxide layer and the spacer; performing a selective epitaxial growth process on both sides of the first semiconductor; performing a high concentration n-type ion doping process on the epitaxial grown semiconductor to form high concentration source and drain; and forming a source metal connecting layer in contact with the high concentration source and the first insulating layer, and a drain metal connecting layer in contact with the high concentration drain and the first insulating layer.

In a seventh aspect of the present invention, a method of fabricating a PMOS device includes: forming a field oxide layer on a silicon on insulator (SOI) substrate having a first insulating layer and a first semiconductor located on the first insulating layer; performing an n-type ion doping process on the first semiconductor located in an active area; forming a gate insulating layer on the first semiconductor; forming a gate on the gate insulating layer; performing a low concentration p-type ion doping process on the first semiconductor to form low concentration source and drain; forming a spacer on sidewalls of the gate; removing the rest portion of the first semiconductor except a portion of the first semiconductor located below the gate oxide layer and the spacer; performing a selective epitaxial growth process on both sides of the first semiconductor; performing a high concentration p-type ion doping process on the epitaxial grown semiconductor to form high concentration source and drain; and forming a source metal connecting layer in contact with the high concentration source and the first insulating layer, and a drain metal connecting layer in contact with the high concentration drain and the first insulating layer.

In an eighth aspect of the present invention, a method of fabricating a BiCMOS device includes: performing a selective epitaxial growth process on a bipolar transistor region in a silicon on insulator (SOI) substrate having a first insulating layer and a p- or n-type first semiconductor located on the first insulating layer; forming a collector plug having the same conductivity as the first semiconductor and doped at a higher concentration than the first semiconductor, in a predetermined region of the first semiconductor; depositing a buffer oxide layer and a nitride layer; patterning the nitride layer to form at least one exposed slit and removing the nitride layer located on a portion where a field oxide layer is to be formed; performing a thermal oxidation process to form the field oxide layer, a collector composed of the first semiconductor surrounded by the field oxide layer and the collector plug, and an oxide layer located on a portion where the collector and the collector plug are in contact with each other and having a smaller thickness than that of the field oxide layer; removing the nitride layer; performing a p-type ion doping process on an NMOS device region and an n-type ion doing process on a PMOS device region; forming a gate oxide layer; depositing a base epitaxial layer which has a conductivity different from that of the first semiconductor; performing a high concentration ion doping process on the base epitaxial layer in a field region; forming a second insulating layer; depositing and patterning a semiconductor having the same conductivity as the first semiconductor and then etching the gate oxide layer and the second insulating layer to form an emitter and a gate of a CMOS device; performing a low concentration n-type ion doping process on the NMOS device region and a low concentration p-type ion doping process on the PMOS device region to form low concentration source and drain of the NMOS device and low concentration source and drain of the PMOS device; forming a spacer on sidewalls of the emitter and the gate of the CMOS device; patterning the base epitaxial layer form a base, and removing the exposed first semiconductors of the NMOS device region and the CMOS device region; removing the oxide layer on the collector plug; performing a selective epitaxial growth process; performing a high concentration n-type ion doping process on the NMOS device region and a high concentration p-type ion doping process on the PMOS device region to form high concentration source and drain of the NMOS device and high concentration source and drain of the PMOS device; and forming a source metal connecting layer of the NMOS device in contact with the high concentration source of the NMOS device and the first insulating layer and a drain metal connecting layer of the NMOS device in contact with the high concentration drain of the NMOS device and the first insulating layer, and forming a source metal connecting layer of the PMOS device in contact with the high concentration source of the PMOS device and the first insulating layer and a drain metal connecting layer of the PMOS device in contact with the high concentration drain of the PMOS device and the first insulating layer.

BRIEF DESCRIPTION OF THE DRAWINGS

The above and other features of the present invention will be described in reference to certain exemplary embodiments thereof with reference to the attached drawings in which.

DETAILED DESCRIPTION OF PREFERRED EMBODIMENTS

Figure 1:
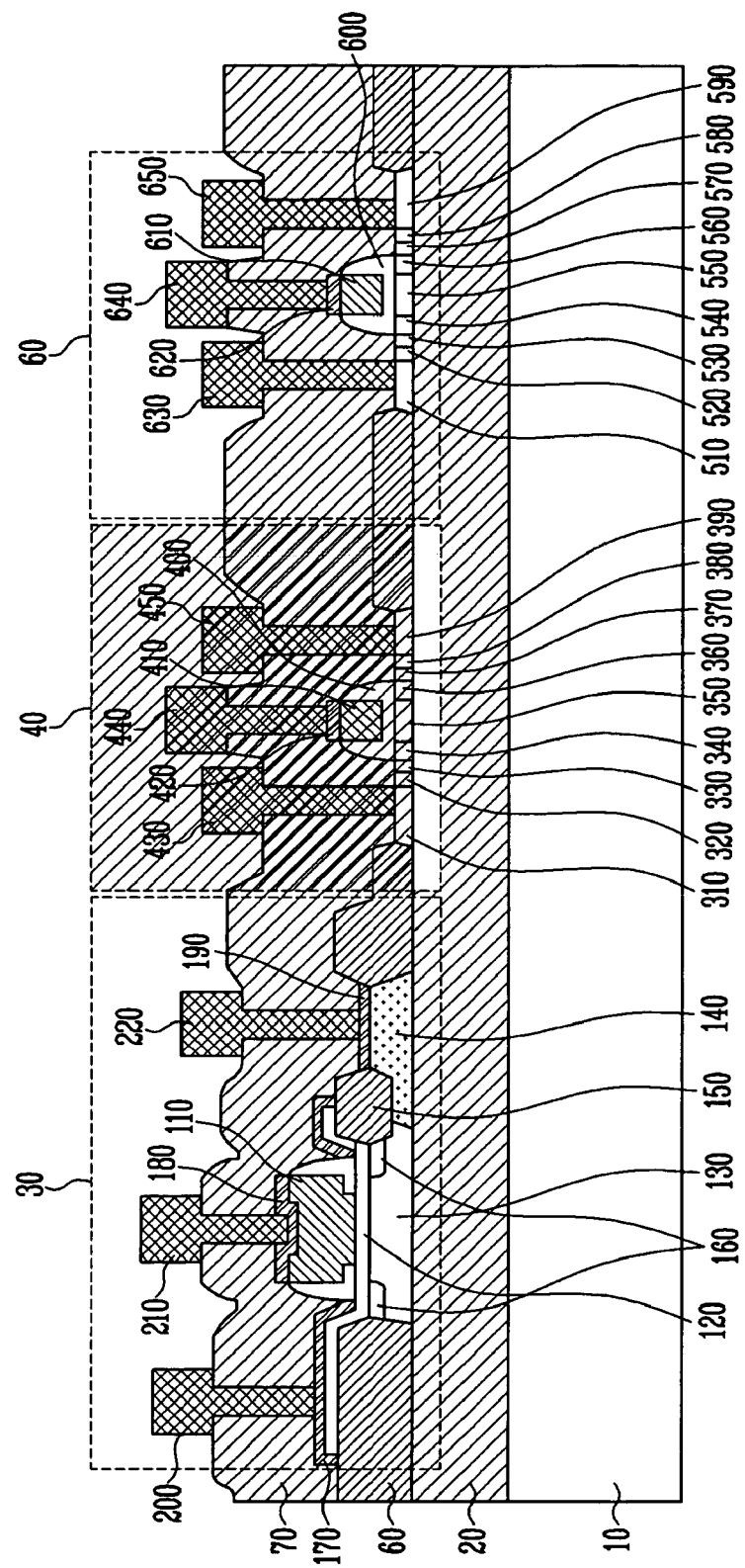
FIG. 1 is a cross-sectional view schematically illustrating a SiGe BiCMOS device according to a preferred embodiment of the present invention.

Reference will now be made in detail to the embodiments of the present invention, examples of which are illustrated in the accompanying drawings, wherein like reference numerals refer to the like elements throughout. The embodiments are described below in order to explain the present invention by referring to the figures.

FIG. 1 is a cross-sectional view schematically illustrating a SiGe BiCMOS device according to a preferred embodiment of the present invention.

Referring to FIG. 1, the SiGe BiCMOS device includes a substrate 10, an insulating layer 20, a SiGe HBT 30, an NMOS device 40, a PMOS device 50, and a field insulating layer 60.

The substrate 10 is preferably a p-type semiconductor having a resistivity of 6 to 100 Ω·cm. A high resistance substrate is a substrate which is doped at a low concentration and has good performance due to small substrate capacitance, but its price is high.

The insulating layer 20 is an oxide layer having a thickness of 0.3 to 2 μm. A thick insulating layer is better because of low power consumption, but an SOI substrate having the thick insulating layer has a disadvantage in that its price is high.

The SiGe HBT 30 includes a collector 130, a collector plug 140, a collector insulating layer 150, a base 120, and an emitter 110. The collector 130 and the collector plug 140 are arranged on the insulating layer 20 and adjacent to each other. The collector insulating layer 150 is arranged on a region that the collector 130 is in contact with the collector plug 140. The base 120 is arranged on the collector 130, and the emitter 110 is arranged on the base 120.

The collector 130 and the collector plug 140 are preferably $n^-$- and $n^+$-doped silicon having a thickness of 2500 to 7000 Å, respectively. The collector insulating layer 150 has a thickness smaller than the field insulating layer 60. The base 120 is preferably formed of a p-type silicon layer having a thickness of 1200 Å. The base 120 may have a multi-layer structure comprised of a buffer layer formed of a silicon layer having a thickness of 400 Å, a SiGe layer having a thickness of 400 Å that Ge of 20% is mixed in silicon, and a cap layer formed of silicon having a thickness of 400 Å. The emitter 110 is preferably formed of an n-type polysilicon layer having a thickness of 3500 Å.

The SiGe HBT 30 has the following advantages in comparison with a conventional one. In the conventional SiGe HBT, a contact between the collector and the collector plug is done through a sub-collector arranged below the collector. However, in the present invention, the collector and the collector plug are directly connected to each other without the sub-collector, so that a leakage current of a capacitor component which flows from the sub-collector to the substrate is removed, thereby significantly reducing power consumption. Further, since an area of the collector insulating layer 150 is reduced, a horizontal area of a device and a degree of integration are increased and an interval between the components is decreased, so that a resistance value of a base external connecting layer between the base 120 and a base metal line 200 is minimized, thereby a noise characteristic is improved. Furthermore, when a high concentration $n^+$ layer may be formed thin such that a high concentration arsenide (As) layer having a thickness of 100 nm is formed around a bottom interface of the collector 130 or phosphorus P is piled up around the bottom interface by doping the phosphorus into the collector 130 and heat-treating it, the current drivability may be improved.

The SiGe HBT 30 may further include a base passivation layer 160 located on an edge of a surface which the base 120 is in contact with the collector 130. The base passivation layer 160 may be formed of a $p^+$-type silicon layer to prevent recombination-extinction of electrons injected from the emitter 110 to the base 120, thereby increasing a current gain. The collector plug 140 is at an appropriate distance from the base passivation layer 160. This is because the current drivability is weakened when the distance is long, and a breakdown voltage is lowered when the distance is short.

The SiGe HBT 30 may further include metal lines 200, 210 and 220 for an external contact of the emitter 110, the base 120 and the collector plug 140. Also, the SiGe HBT 30 may further include silicides 170, 180 and 190 to improve a contact characteristic between the metal lines 200, 210 and 220 and the emitter 110, the base 120 and the collector plug 140. The metal lines 200, 210 and 220 are arranged in contact holes of an insulating layer 70, respectively.

The NMOS device 40 includes: a channel layer 350 which is a p-type semiconductor and located on the oxide layer 20; sources 330 and 340 and drains 360 and 370 which are n-type semiconductors, in contact with both sides of the channel layer 350, and located on the oxide layer 20; a source silicide 320 and a drain silicide 380 located on the oxide layer 20 to be in contact with the sources 330 and 340 and the drains 360 and 370, respectively; source metal lines 310 and 430 and drain metal lines 390 and 450 located on the oxide layer 20 to be in contact with the source silicide 320 and the drain silicide 380; a gate oxide layer 400 located on the channel layer 350; a gate 410 located on the gate oxide layer 400; a gate silicide 420 located on the gate 410; and a gate metal line 440 in contact with the gate silicide 420.

The channel layer 350 preferably has a thickness of 500 to 1000 Å. The sources 330 and 340 and the drains 360 and 370 may include low concentration n-type semiconductors 340 and 360 adjacent to the channel layer 350, and high concentration n-type semiconductors 330 and 370 adjacent to the low concentration n-type semiconductors 340 and 360. Preferably, the high concentration n-type semiconductors 330 and 370 are n-type SiGe. The silicides 320, 380 and 420 may be optionally formed because they are formed to improve a contact characteristic. The source metal lines 310 and 430 and the drain metal lines 390 and 450 may be comprised of a source metal connecting layer 310 and a drain metal connecting layer 390 located on the oxide layer 20 to be in contact with the source silicide 320 and the drain silicide 380 respectively, and a source metal line 430 and a drain metal line 450 respectively in contact with the source metal connecting layer 310 and the drain metal connecting layer 390.

The PMOS device 50 includes: a channel layer 550 which is an n-type semiconductor, and located on the oxide layer 20; sources 530 and 540 and drains 560 and 570 which are p-type semiconductors, and located on the oxide layer 20 to be in contact with both sides of the channel layer 550 respectively; a source silicide 520 and a drain silicide 580 located on the oxide layer 20 to be in contact with the sources 530 and 540 and the drains 560 and 570 respectively; source metal lines 510 and 630 and drain metal lines 590 and 650 located on the oxide layer 20 to be in contact with the source silicide 520 and the drain silicide 580 respectively; a gate oxide layer 600 located on the channel layer 550; a gate 610 located on the gate oxide layer 600; a gate silicide 620 located on the gate 610; and a gate metal line 640 in contact with the gate silicide 620.

The channel layer 550 preferably has a thickness of 500 to 1000 Å. The sources 530 and 540 and the drains 560 and 570 may be composed of low concentration p-type semiconductors 540 and 560 adjacent to the channel layer 550 and high concentration p-type semiconductors 530 and 570 adjacent to the low concentration p-type semiconductors. Preferably, the high concentration p-type semiconductors 530 and 570 are p-type SiGe. The sulicides 520, 580 and 620 may be optionally formed because they are formed to improve a contact characteristic. The source metal lines 510 and 630 and the drain metal lines 590 and 650 may be composed a source metal connecting layer 510 and a drain metal connecting layer 590 located on the oxide layer 20 to be in contact with the source silicide 520 and the drain silicide 580 respectively, and a source metal line 630 and a drain metal line 650 in contact with the source metal connecting layer 510 and the drain metal connecting layer 590, respectively.

The NMOS device 40 and the PMOS device 50 prevent a leakage current resulting from parasitic bipolar operation by employing a SiGe hetero junction layer other than Si as the sources 330, 340, 530 and 540 and the drains 360, 370, 560 and 570, prevent a drop of a voltage required for device operation due to a resistance decrease by employing a metal such as Ni other than existing silicon as the source metal connecting layers 310 and 510 and the drain metal connecting layer 390 and 590 which respectively connect the sources 330, 340, 530 and 540 and the drains 360, 370, 560 and 570 to the source metal lines 430 and 630 and the drain metal lines 450 and 650 to make low voltage/low power operation possible and to obtain a wide operation range for low voltage analog circuit operation. A low resistance of the source and drain region suppresses heat from generating, thereby solving a heat dissipation problem of the SOI semiconductor. The CMOS serves as a perfect depletion layer because the channel layers 350 and 550 formed on the SOI substrate are formed to a small thickness of less than 1000 Å.

FIGS. 2 to 21 are cross-sectional views illustrating a process of fabricating a SiGe BiCMOS device according to a preferred embodiment of the present invention.

Figure 2:
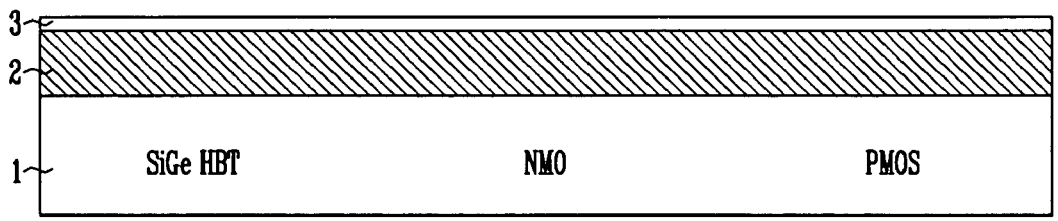
FIGS. 2 to 21 are cross-sectional views illustrating a process of fabricating a SiGe BiCMOS device according to a preferred embodiment of the present invention.

Referring to FIG. 2, a substrate 1 which is an SOI wafer is a p-type semiconductor having a resistivity of 6 to 100 Ω·cm. A high resistance substrate is a substrate which is doped at a low concentration and has a small substrate capacitance but is high in cost. An oxide layer 2 has a thickness of 0.3 to 2 μm. The thick oxide layer is better, but its price is high. An active layer 3 preferably has a thickness of less than 500 to 1000 Å. The active layer 3 is doped with phosphorus P in a collector doping process which will be described later, and when the phosphorus P is piled up on an interface with the oxide layer during growth of a field oxide layer, an n$^+$ layer is formed. The n$^+$ layer serves to improve a limit of current drivability.

Figure 3:
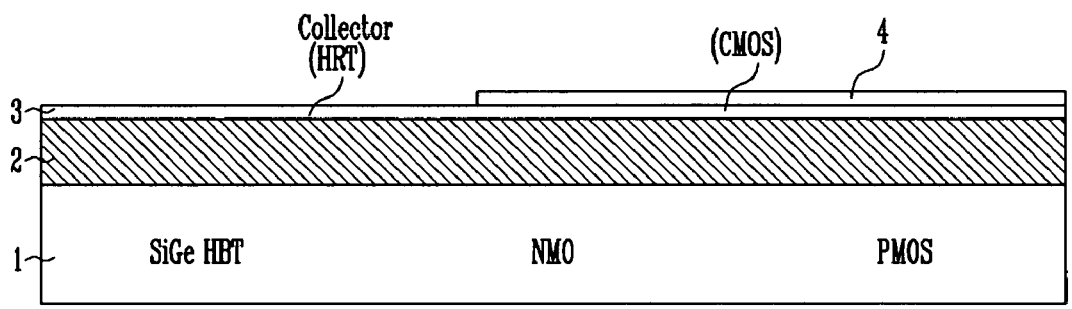

Referring to FIG. 3, the active layer is formed on the SOI wafer to be thinner in a CMOS region than in an HBT region. If a thin oxide layer 4 having a thickness of 1000 to 2000 Å is formed in the CMOS region by a low temperature oxide (LTO) deposition method at a temperature of 400° C., it is possible to prevent the growth of an epitaxial layer in this region during growth of a collector epitaxial layer of the HBT.

Figure 4:
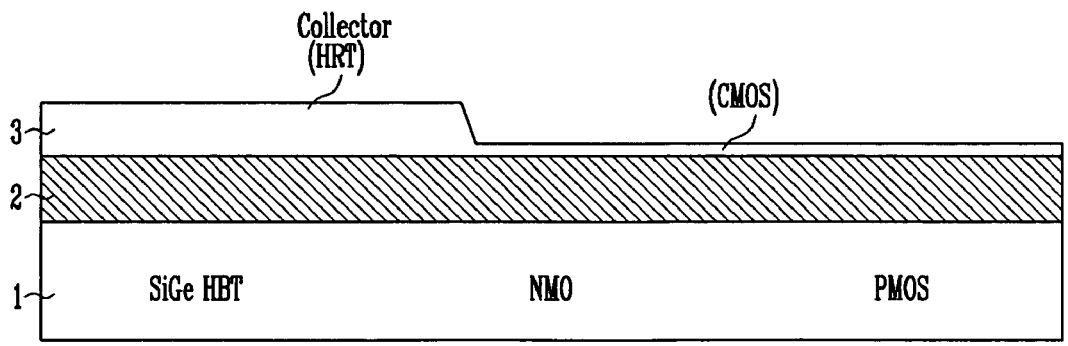

Referring to FIG. 4, a collector epitaxial layer 3 is grown on the SOI wafer by a selective reduced pressure chemical vapor deposition (CVD) method. Here, an atmospheric pressure is 30 mtorr, a temperature is 1100° C., used gases are $SiH_2Cl_2$, HCl, $PH_3$, and $H_2$. The selective epitaxial growth method is a method that the collector epitaxial layer grows only in the HBT region but does not grow in the CMOS region covered with the oxide layer. This may be achieved by appropriately adjusting a flow ratio between $SiH_2Cl_2$ and HCl. This is because as the amount of HCl is increased, the selectivity of the epitaxial growth is improved but a growth rate is lowered. The collector epitaxial layer has a thickness of 2000 to 4000 Å. If a thickness of the collector epitaxial layer is small, its operating speed is high and thus it is suitable for a high frequency (RF) device, and when its thickness is large, its operating speed is lowered but a breakdown voltage is high and thus it is suitable for a power device. The total thickness of the collector for a typical small signal RF device is preferably 4000 Å. The epitaxial layer has a concentration of phosphorus ranging from $5×10^{16}$ to $2×10^{17}/cm^2$. In order to improve both the operating speed and the breakdown voltage, it should have a high concentration as its thickness is small and a low concentration as its thickness is large.

Figure 5:
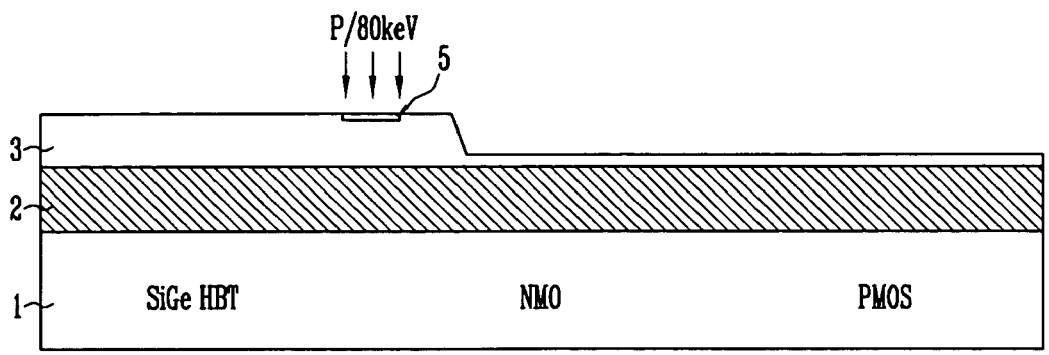

Referring to FIG. 5, a collector plug 5 is formed by performing a high concentration ion implantation process to reduce a resistance of a region which is guided to an external terminal of the collector. This ion implantation process is to deeply diffuse impurities into the collector plug region during growth of a field oxide layer. The ion implantation process is performed with P ions having a concentration of $4×10^{15}/cm^2$ at an energy of 80 KeV.

Figure 6:
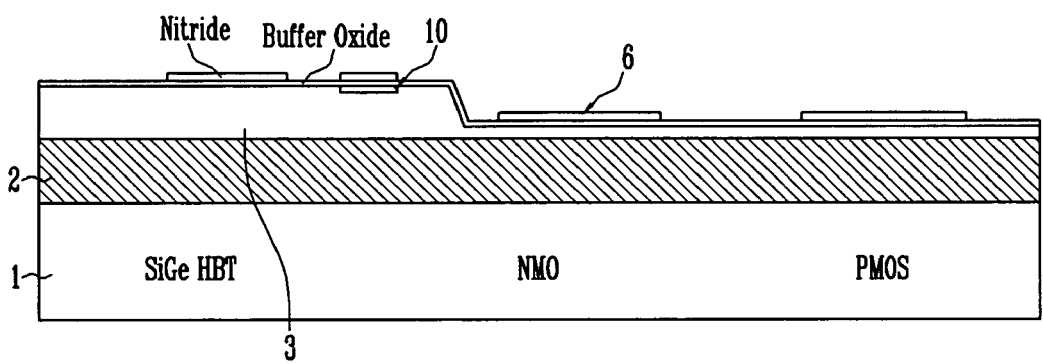

Referring to FIG. 6, this is a step before growing a filed oxide layer for electrical isolation between elements and is a process that deposits an oxide layer and a nitride layer 6 ($Si_3N_4$) for a buffer and then removes the nitride layer 6 in a region in which the field oxide layer is to be formed. When the nitride layer 6 is patterned, it is divided into an active region and a non active region, i.e., a field region. The buffer layer is formed to a thickness of 400 Å by a low temperature oxide (LTO) deposition method at a temperature of 400° C. The nitride layer 6 is formed to a thickness of 1200 to 1600 Å by a low pressure chemical vapor deposition (LPCVD) method at a temperature of 730° C.

Figure 7:
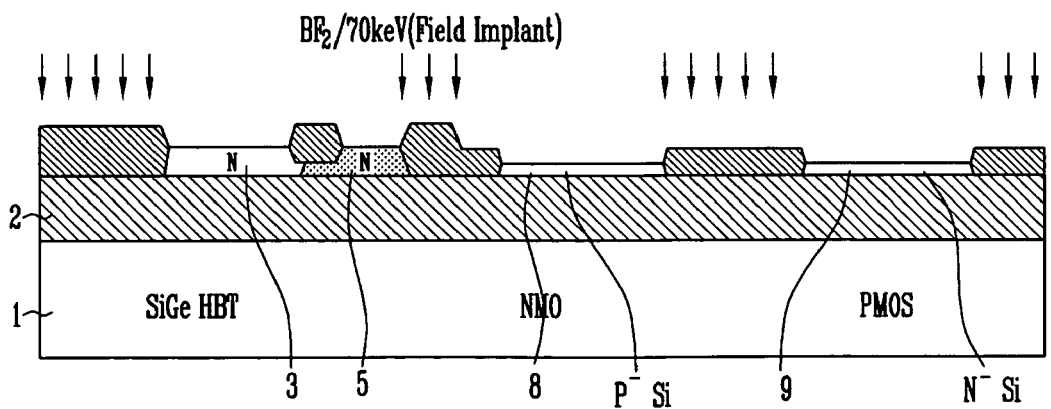

Referring to FIG. 7, the growth of the thick field oxide layer 7 is performed. For more perfect isolation before the growth of the field oxide layer 7, a region on which the field oxide layer 7 is to be formed is subjected to an ion implantation process whose condition is BF2, 70 KeV, $5×10^{13}/cm^2$, and then the field oxide layer 7 is grown in a furnace of 1000° C. for four hours. Here, the field oxide layer 7 has a thickness of 6500 Å. The nitride layer remaining after the growth of the field oxide layer is corroded by a heated phosphoric acid to be removed.

Figure 8:
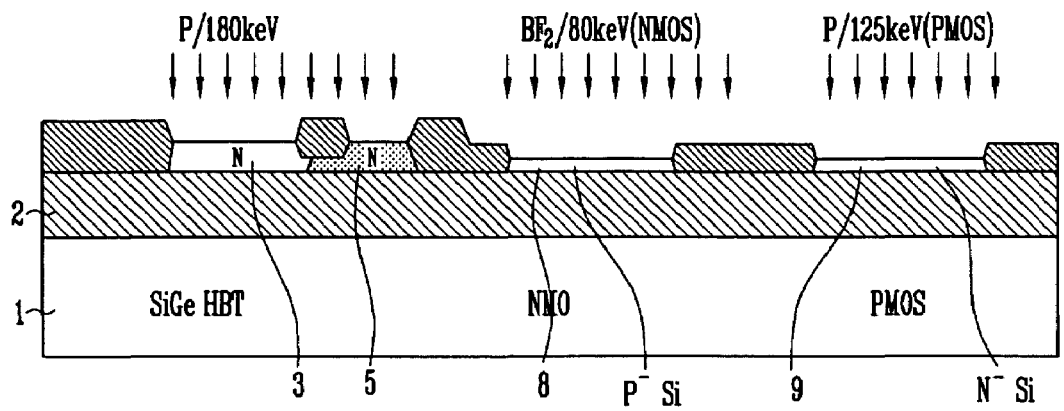

Referring to FIG. 8, the collector 3 of the selected HBT is subjected to ion implantation, or an ion implantation process is additionally performed to finely adjust an operating voltage (i.e., threshold voltage) of an NMOS 8 and a PMOS 9. An ion implantation process of the HBT collector region 3 is performed for the selected HBT device. And since the operating speed may be improved significantly even though a breakdown voltage is lowered to 3 volts, the ion implantation process is selectively performed for circuit devices which need to be used for high-speed digital or high-speed analog. The ion implantation condition is P, 180 KeV, $2×10^{13}/cm^2$ for the HBT collector region, $BF_2$, 80 KeV, $7.7×10^{12}/cm^2$ for operating voltage adjustment of the NMOS, and P, 125 KeV, $5.5×10^{11}/cm^2$ for operating voltage adjustment of the PMOS.

Figure 9:
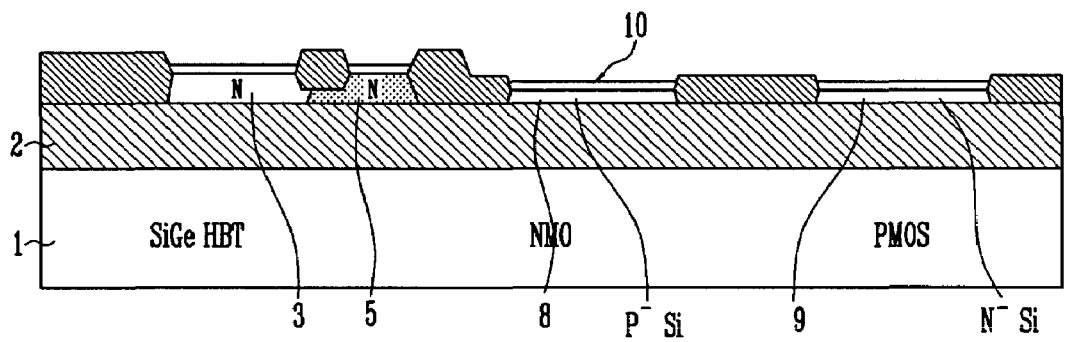

Referring to FIG. 9, a gate oxide layer 10 of the CMOS is grown. The growth of the gate oxide layer 10 is performed in a furnace of 850° C. for one hour. The gate oxide layer 10 has a thickness of 150 Å in a gate line width of 0.5 μm. The thickness of the gate oxide layer 10 is adjusted according to the gate line width and may be lowered to 20 Å in case of a nano device.

Figure 10:
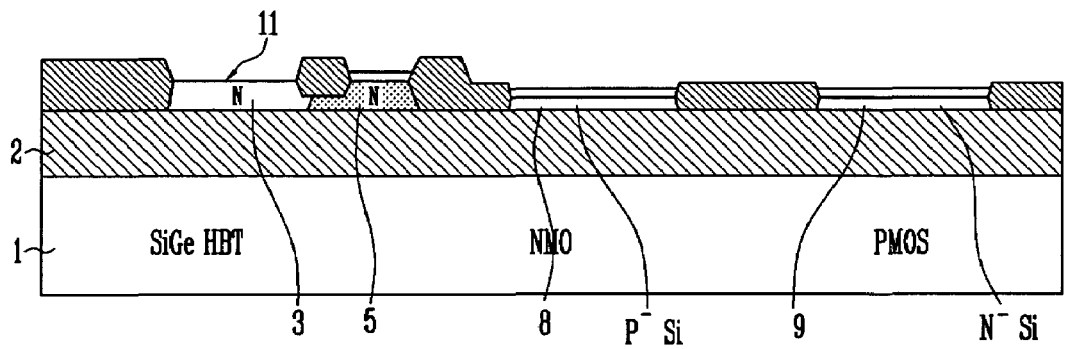

Referring to FIG. 10, a portion of the gate oxide layer which is unnecessarily grown in an active region of the HBT is removed by a wet etching method.

Figure 11:
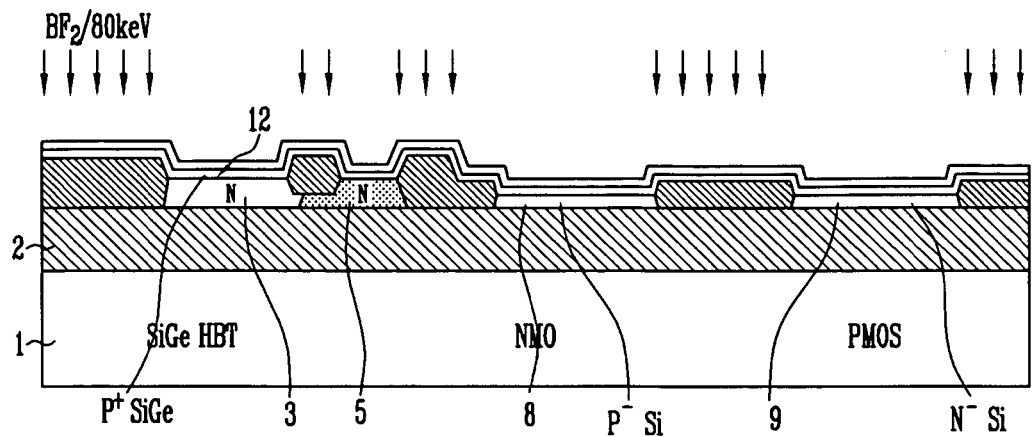

Referring to FIG. 11, a base epitaxial layer 12 having a thickness of 1200 Å which serves as a base of the HBT is grown, a passivation oxide layer is deposited on the base epitaxial layer, and a high concentration ion implantation process for the base epitaxial layer in the field region is performed.

The growth of the base epitaxial layer is performed such that a buffer layer is formed to a thickness of 400 Å on the collector, a SiGe layer containing Ge of 20% is formed to a thickness of 400 Å, and a cap layer is formed to a thickness of 400 Å on the layers. The buffer layer and the cap layer are non-doped silicon layers. Of these, a $p^+$ layer which substantially serves as a base is a layer into which a boron B ion is doped and occupies a very small thickness of 150 Å in the SiGe layer, and has a very high concentration of $5 \times 10^{19}/cm^2$ and thus it is possible to perform a high-speed operation while maintaining a breakdown voltage of the collector. The growth of the base epitaxial layer 12 is performed by a reduced pressure CVD method under conditions of an atmospheric pressure of tens of torrs and a temperature of 650 to 700° C., and used gases are $SiH_4$, $GeH_4$, $B_2H_6$, and $H_2$.

The passivation oxide layer on the base is formed by an LTO deposition method at a temperature of 400° C. and has a thickness of 400 Å. An addition high concentration ion implantation process for the field base epitaxial layer is a process for reducing a resistance of a base external connecting layer, and obtaining a stable resistance of a base resistor which is a high resistor as a passive device when an integrated circuit is manufactured.

Figure 12:
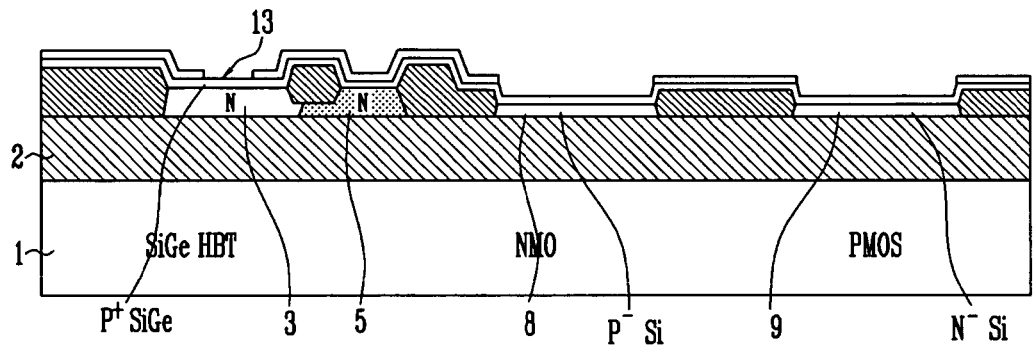

Referring to FIG. 12, an oxide layer is additionally deposited to form an interlayer insulating layer between a base and an emitter of the HBT, and thereafter the oxide layer in a gate region of the CMOS is an unnecessary portion and thus removed to form exposed holes 13 at a location on which an emitter and a collector are to be formed. An interlayer insulating layer which is additionally deposited is formed by an LTO deposition method at a temperature of 400° C. and has a thickness of 800 Å.

Figure 13:
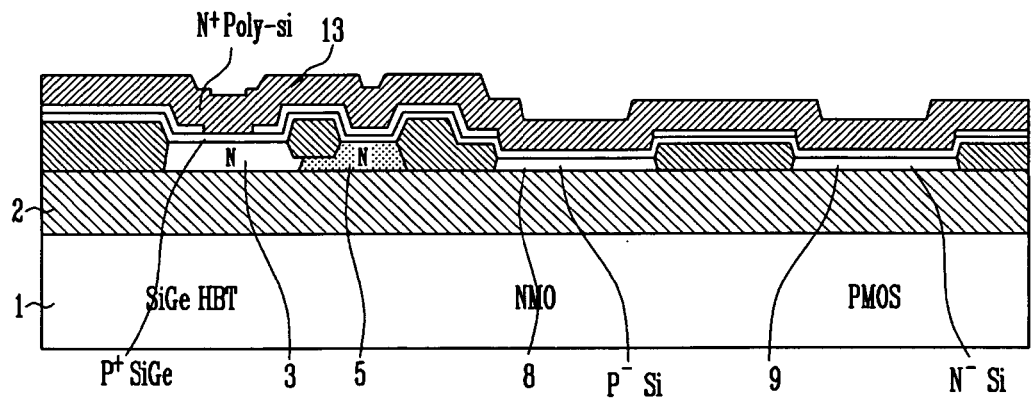

Referring to FIG. 13, a polysilicon layer 13 is deposited to form an emitter layer of the HBT and a gate layer of the CMOS. The polysilicon layer is formed by an LPCVD method at a temperature of 625° C. and has a thickness of 2000 to 3500 Å.

Figure 14:
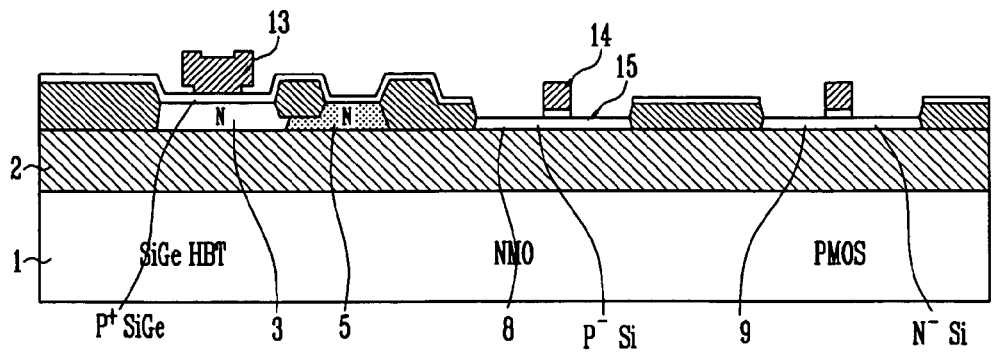

Referring to FIG. 14, the polysilicon layer is patterned to form an emitter 13 of the HBT and a gate 14 of the CMOS, and the oxide layer on the bottom thereof is removed.

Figure 15:
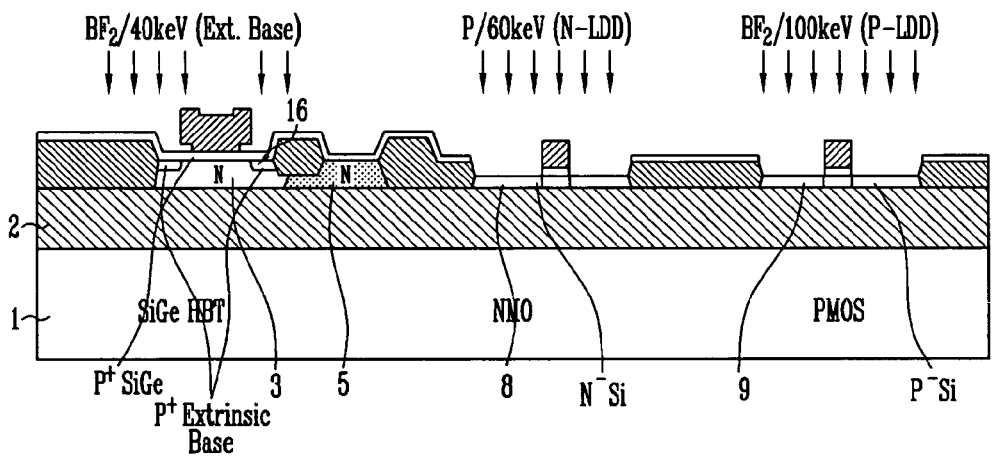

Referring to FIG. 15, an ion implantation process is performed into the source and drain regions 8 and 9 of the NMOS and the PMOS to form source and drain extension regions, i.e., lightly doped drain (LDD) regions, and a $p^+$-type base passivation layer 16 is formed on an edge of the active layer between an active region and a field region of the HBT. The LDD regions serve to improve operation voltage of the CMOS and suppress creation of hot carriers, and an ion implantation process for the base passivation layer 16 of the HBT serves to prevent the recombination-extinction of electrons injected into from the emitter to the base in this region to thereby increase a current gain. The ion implantation condition is P, 60 KeV for an N-LDD, $2.2 \times 10^{13}/cm^2$, is $BF_2$, 100 KeV, $9.0 \times 10^{12}/cm^2$ for P-LDD, and is $BF_2$, 40 KeV, $4.0 \times 10^{14}/cm^2$ for an edge of the active layer of the HBT.

Figure 16:
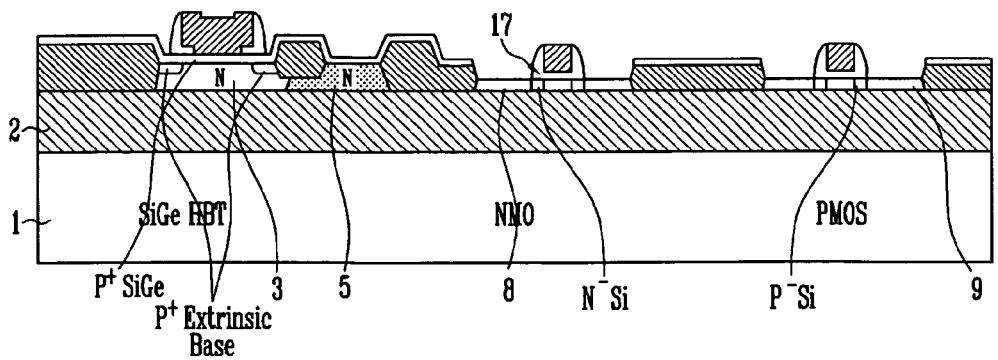

Referring to FIG. 16, an oxide layer is formed to a thickness of 2000 Å on sidewalls of the emitter of the HBT and sidewalls of the gates of the NMOS and the PMOS and then etched to remain the oxide layer only on the sidewalls 17. This is a typical method of increasing an insulation characteristic and a breakdown voltage between the emitter and the base of the HBT and between the gate and the source and drain of the CMOS, and this may easily be implemented by an LTO deposition method and a reactive ion etching (RIE) method.

Figure 17:
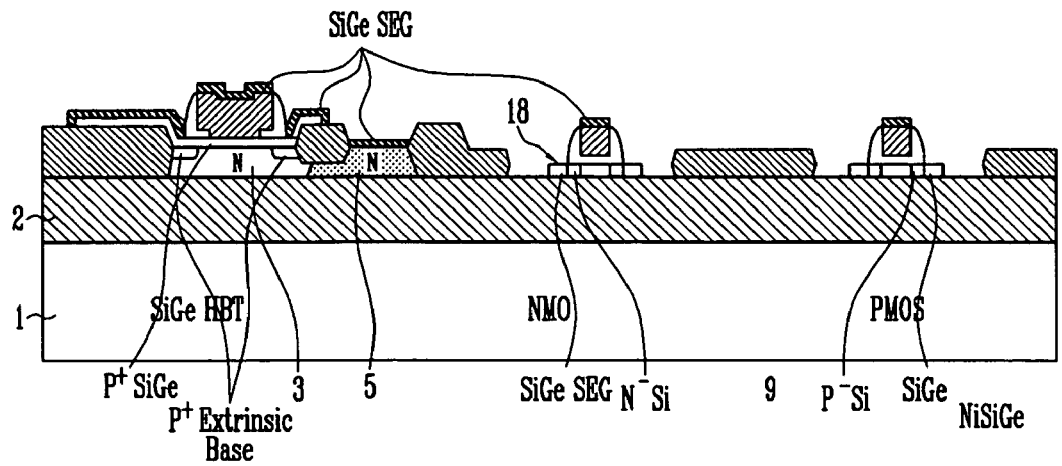

Referring to FIG. 17, a base external connecting layer of the HBT is formed by patterning, the thin silicon layer remaining on the bottom of the source and drain of the CMOS is removed, the oxide layer over the collector plug is removed, and the selective epitaxial growth process of the SiGe layer is performed in a sidewall region of the channel layer below the exposed base external connecting layer and the gate of the CMOS. The selective epitaxial growth is performed for the polysilicon layer or the silicon layer which does not have the sidewall oxide layer, that is, the emitter, the base external connecting layer, the gate, and the sidewall of the channel layer but is not performed for a portion covered with the oxide layer. The growth layer is formed such that an epitaxial layer is grown on the exposed silicon epitaxial layer and the polysilicon is grown on the polysilicon layer. The growth layer makes the base external connecting layer of the HBT thick to thereby stabilize a process while forming a metal silicide which will be described later and reduce an electrical resistance of the base external connecting layer, and the SiGe epitaxial growth layer 18 grown on the sidewalls of the channel layer of the CMOS becomes a source and a drain. The selective epitaxial growth is performed under conditions of an atmospheric pressure of tens of torrs and a temperature of 650 to 700° C., and used gases are $SiH_2Cl_2$, $GeH_4$, HCl and $H_2$, and a growth thickness is 1000 to 3000 Å.

Figure 18:
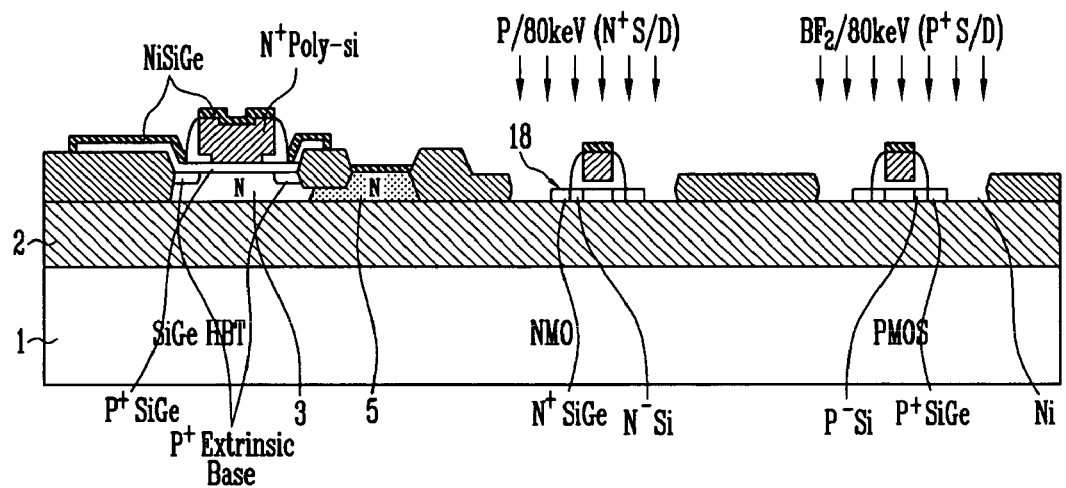

Referring to FIG. 18, the source and drain region 18 of the CMOS is subjected to a high concentration ion implantation process. The ion implantation is performed with P ions having a concentration of $8.0 \times 10^{15}/cm^2$ at an energy of 80 KeV for NMOS source and drain regions, and $BF_2$ ions having a concentration of $3.7 \times 10^{15}/cm^2$ at an energy of 80 KeV for PMOS source and drain regions.

Figure 19:
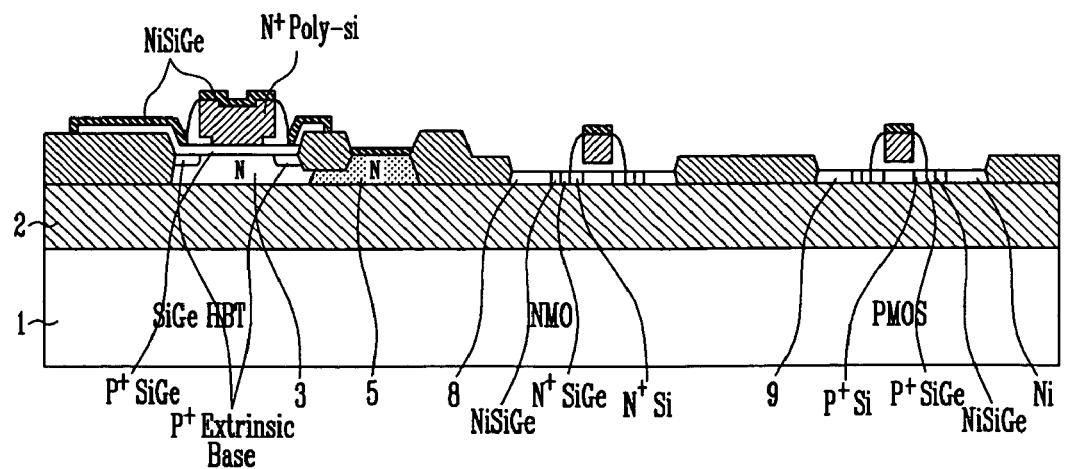

Referring to FIG. 19, a silicide which is a compound of silicon and metal is formed. As the silicide metal, Ni is deposited to a thickness of 500 to 1000 Å using a sputter deposition system. Then a first heat treatment process is performed at a temperature of less than 600° C. to form a silicide (NiGeSi), and a portion that the silicide is not formed is removed by an etching method. Here, Ni that the silicide is not formed is etched, but Ni in the source and drain region is covered by a mask and not removed. The silicide has a resistivity of 4 to 10 Ω·cm. Meanwhile, in the case that the Ni layer which remains on the source and drain region is all removed, the Ni layer is removed using $H_2SO_4$+ $H_2O_2$ of 1:1 by a wet etching method such that the NiGeSi layer and a metal line may be directly connected in a metallization process for an external metal line which will be described later. The silicide is formed on all portions in which the selective epitaxial growth occur, i.e., regions that the silicon layer or the polysilicon layer is exposed, but not formed on a region covered with the oxide layer and, thus it is called self aligned silicidation (salicide).

Figure 20:
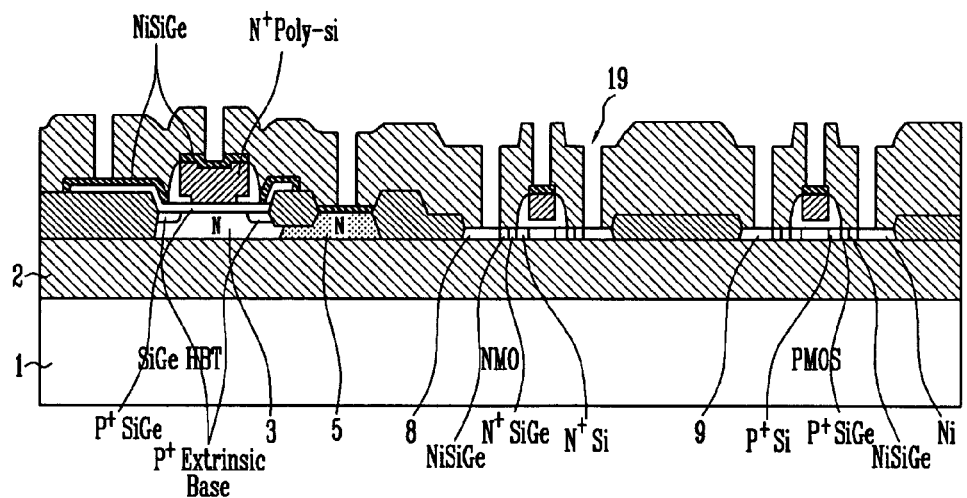

Referring to FIG. 20, an interlayer insulating layer 19 is formed, and is etched to have contact holes. The interlayer insulating layer 19 is formed by an LTO deposition method at a temperature of 400° C. and has a thickness of 6000 Å.

Figure 21:
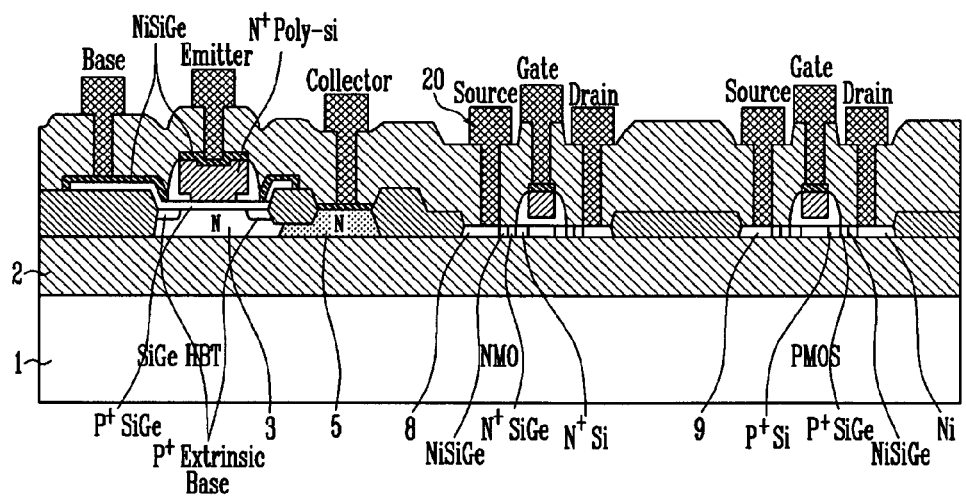

Referring to FIG. 21, a metal layer composed of Ti/TiN/Al is deposited using a sputter deposition system and patterned to form a metal line layer 20. The metal line layer 20 is subjected to an alloy process at an atmosphere of 450° C. and $N_2/H_2$ for 30 minutes, thereby completing a BiCMOS. Meanwhile, in the case that the Ni layer which remains on the source and drain regions is removed, when the contact holes are formed in the process of FIG. 20, the NiGeSi layer is exposed, and then the NiGeSi layer is directly connected to the metal line layer using an Al low temperature-low pressure (600° C., $10^{-8}$ torr) flowing method or an oxygen catalyst-flowing method at a low temperature of 600° C. after coating the metal line layer with, for example, Cu and Ag.

The BiCMOS fabricated by the above described method may prevent a leakage current due to a parasitic bipolar operation by forming the source and drain of the CMOS using a SiGe hetero junction layer other than Si, prevent a voltage required for a device operation from being dropped due to a resistance decrease to thereby make low voltage/low power operation possible by connecting the source and drain to the external metal line connecting layer using a metal such Ni other than the silicon, and obtain a wide operation range for an analog circuit operation at a low voltage. Also, the source and drain regions have a low resistance and thus suppress heat generation, thereby solving a heat dissipation problem of the SOI semiconductor.

As described herein before, the NMOS device, the PMOS device and the SiGe BiCMOS device and the method of fabricating the same according to the present invention has advantages of reducing power consumption, suppressing heat generation in the chip, and obtaining a wide operation area at a low voltage.

The NMOS device, the PMOS device and the SiGe HBT device and the method of fabricating the same according to the present invention may mount an HBT which is excellent in RF and analog performance on the substrate as an SOI CMOS which is widely being used for low power, and particularly, prevent a leakage current due to a parasitic bipolar operation by forming the source and drain of the CMOS using a SiGe hetero junction layer other than Si, prevent a drop of a voltage required for device operation due to a resistance decrease to thereby make low voltage/low power operation possible by connecting the source and drain to the external metal line connecting layer using a metal such Ni other than the silicon, and obtain a wide operation area for analog circuit operation at a low voltage. Also, the source and drain region has a low resistance and thus suppress heat generation, thereby solving a heat dissipation problem of the SOI semiconductor.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. An NMOS device comprising:
   a first insulating layer;
   a channel layer which is a p-type semiconductor, and in contact with a top surface of the first insulating layer;
   a source and a drain which are n-type semiconductors, and in contact with both sides of the channel layer respectively and a top surface of the first insulating layer;
   a gate insulating layer located on the channel layer;
   a gate located on the gate insulating layer;
   a source metal connecting layer which is a conductor, and in contact with a top surface of the first insulating layer and a source silicide located between the source and the source metal connecting layer;
   a drain metal connecting layer which is a conductor, and in contact with a top surface of the first insulating layer and a drain silicide located between the drain and the drain metal connecting layer;
   a source metal line which is a conductor, and in contact with the source metal connecting layer;
   a drain metal line which is a conductor, and in contact with the drain metal connecting layer; and
   a gate metal line which is a conductor, and in contact with a gate silicide located between the gate and the gate metal line.

2. The device as recited in claim 1, wherein the source includes a low concentration source which is a low concentration n-type semiconductor in contact with the channel layer and a high concentration source which is a high concentration n-type semiconductor in contact with the low concentration source, and the drain includes a low concentration drain which is a low concentration n-type semiconductor in contact with the channel layer and a high concentration drain which is a high concentration n-type semiconductor in contact with the low concentration drain.

3. The device as recited in claim 2, wherein the high concentration source and the high concentration drain are formed of n-type SiGe.

* * * * *